(12) United States Patent
Best et al.

(10) Patent No.: US 11,669,124 B2
(45) Date of Patent: *Jun. 6, 2023

(54) DRIFT TRACKING FEEDBACK FOR COMMUNICATION CHANNELS

(71) Applicant: Rambus Inc., San Jose, CA (US)

(72) Inventors: Scott C. Best, Palo Alto, CA (US); Abhijit M. Abhyankar, Sunnyvale, CA (US); Kun-Yung Chang, Los Altos, CA (US); Frank Lambrecht, Danville, CA (US)

(73) Assignee: Rambus Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/715,869

(22) Filed: Apr. 7, 2022

(65) Prior Publication Data

US 2022/0300030 A1    Sep. 22, 2022

Related U.S. Application Data

(63) Continuation of application No. 16/707,957, filed on Dec. 9, 2019, now Pat. No. 11,327,524, which is a
(Continued)

(51) Int. Cl.
*G06F 1/08* (2006.01)
*G11C 29/02* (2006.01)
(Continued)

(52) U.S. Cl.
CPC ............... *G06F 1/08* (2013.01); *G06F 1/12* (2013.01); *G11C 29/02* (2013.01); *G11C 29/022* (2013.01);
(Continued)

(58) Field of Classification Search
CPC .. G06F 1/08; G06F 1/12; G11C 29/02; G11C 29/022; G11C 29/028; G11C 29/50012;
(Continued)

(56) References Cited

U.S. PATENT DOCUMENTS 3,155,102 A    11/1964   Niederer, Jr. et al.
3,638,121 A     1/1972   Spilker, Jr.
(Continued)

FOREIGN PATENT DOCUMENTS

JP    2000-035831 A     2/2000
WO   WO-2001-016954 A1  3/2001

OTHER PUBLICATIONS

"Draft Standard for a High-Speed Memory Interface (SyncLink)," Draft 0.99 IEEE P1596.7-199X, pp. 1-56 (1996), Microprocessor and Microcomputer Standards Subcommittee of the IEEE Computer Society. 66 pages.
(Continued)

*Primary Examiner* — Zahid Choudhury
(74) *Attorney, Agent, or Firm* — Womble Bond Dickinson (US) LLP (57) ABSTRACT

A memory controller having a data receiver to sample data at a sample timing using a strobe signal, wherein the data and the strobe signal are sent by a memory device in connection with a read operation initiated by the memory controller, and a strobe receiver to receive the strobe signal, wherein a phase of the strobe signal has a drift relative to a reference by an amount. The memory controller further having a monitoring circuit to monitor the strobe signal and determine the amount of the drift, and an adjustment circuit to update the sample timing of the data receiver based on the amount of drift determined by the monitoring signal.

20 Claims, 6 Drawing Sheets

Related U.S. Application Data continuation of application No. 15/616,795, filed on Jun. 7, 2017, now Pat. No. 10,503,201, which is a continuation of application No. 14/751,312, filed on Jun. 26, 2015, now Pat. No. 9,710,011, which is a continuation of application No. 13/949,101, filed on Jul. 23, 2013, now Pat. No. 9,124,390, which is a continuation of application No. 12/619,076, filed on Nov. 16, 2009, now Pat. No. 8,504,863, which is a continuation of application No. 11/744,006, filed on May 3, 2007, now Pat. No. 7,640,448, which is a continuation of application No. 11/560,031, filed on Nov. 15, 2006, now Pat. No. 7,526,664, which is a continuation of application No. 11/243,032, filed on Oct. 4, 2005, now Pat. No. 7,159,136, which is a continuation of application No. 10/802,634, filed on Mar. 17, 2004, now Pat. No. 6,961,862.

(51) Int. Cl.

| | | |
|---|---|---|
| *G11C 29/50* | (2006.01) | |
| *H04L 7/00* | (2006.01) | |
| *H04L 7/033* | (2006.01) | |
| *H04L 7/10* | (2006.01) | |
| *H04L 25/14* | (2006.01) | |
| *G06F 1/12* | (2006.01) | |

(52) U.S. Cl.
CPC ...... *G11C 29/028* (2013.01); *G11C 29/50012* (2013.01); *H04L 7/0008* (2013.01); *H04L 7/0033* (2013.01); *H04L 7/0091* (2013.01); *H04L 7/033* (2013.01); *H04L 7/10* (2013.01); *H04L 25/14* (2013.01); *H04L 7/0004* (2013.01)

(58) Field of Classification Search
CPC ... H04L 7/0008; H04L 7/0033; H04L 7/0091; H04L 7/033; H04L 7/10; H04L 25/14; H04L 7/0004
See application file for complete search history.

(56) References Cited

U.S. PATENT DOCUMENTS

| | | | |
|---|---|---|---|
| 3,922,491 | A | 11/1975 | Bjork et al. |
| 4,384,354 | A | 5/1983 | Crawford et al. |
| 4,648,133 | A | 3/1987 | Vilnrotter |
| 5,111,208 | A | 5/1992 | Lopez |
| 5,122,978 | A | 6/1992 | Merrill |
| 5,243,626 | A | 9/1993 | Devon et al. |
| 5,265,211 | A | 11/1993 | Amini et al. |
| 5,329,489 | A | 7/1994 | Diefendorff |
| 5,436,908 | A | 7/1995 | Fluker et al. |
| 5,485,490 | A | 1/1996 | Leung et al. |
| 5,485,602 | A | 1/1996 | Ledbetter, Jr. et al. |
| 5,500,644 | A | 3/1996 | Denjean et al. |
| 5,511,091 | A | 4/1996 | Saito |
| 5,523,760 | A | 6/1996 | McEwan |
| 5,541,967 | A | 7/1996 | Gluska et al. |
| 5,548,146 | A | 8/1996 | Kuroda et al. |
| 5,554,945 | A | 9/1996 | Lee et al. |
| 5,621,913 | A | 4/1997 | Tuttle et al. |
| 5,671,376 | A | 9/1997 | Bucher et al. |
| 5,684,966 | A | 11/1997 | Gafford et al. |
| 5,742,798 | A | 4/1998 | Goldrian |
| 5,745,011 | A | 4/1998 | Scott |
| 5,771,356 | A | 6/1998 | Leger et al. |
| 5,778,436 | A | 7/1998 | Kedem et al. |
| 5,859,881 | A | 1/1999 | Ferraiolo et al. |
| 6,047,346 | A | 4/2000 | Lau et al. |
| 6,154,821 | A | 11/2000 | Barth et al. |
| 6,163,570 | A | 12/2000 | Olafsson |
| 6,173,345 | B1 | 1/2001 | Stevens |
| 6,181,166 | B1 | 1/2001 | Krishnamurthy et al. |
| 6,219,384 | B1 | 4/2001 | Kliza et al. |
| 6,243,776 | B1 | 6/2001 | Lattimore et al. |
| 6,282,210 | B1 | 8/2001 | Rapport et al. |
| 6,321,282 | B1 | 11/2001 | Horowitz et al. |
| 6,359,931 | B1 | 3/2002 | Perino et al. |
| 6,369,652 | B1 | 4/2002 | Nguyen et al. |
| 6,374,375 | B1 | 4/2002 | Yip et al. |
| 6,377,640 | B2 | 4/2002 | Trans |
| 6,396,329 | B1 | 5/2002 | Zerbe |
| 6,418,070 | B1 | 7/2002 | Harrington et al. |
| 6,421,389 | B1 | 7/2002 | Jett et al. |
| 6,434,081 | B1 | 8/2002 | Johnson et al. |
| 6,442,644 | B1 | 8/2002 | Gustavson et al. |
| 6,448,815 | B1 | 9/2002 | Talbot et al. |
| 6,457,089 | B1 | 9/2002 | Robbins et al. |
| 6,463,392 | B1 | 10/2002 | Nygaard et al. |
| 6,469,555 | B1 | 10/2002 | Lau et al. |
| 6,473,439 | B1 | 10/2002 | Zerbe et al. |
| 6,480,026 | B2 | 11/2002 | Andrews et al. |
| 6,480,946 | B1 | 11/2002 | Tomishima et al. |
| 6,484,232 | B2 | 11/2002 | Olarig et al. |
| 6,496,911 | B1 | 12/2002 | Dixon et al. |
| 6,510,503 | B2 | 1/2003 | Gillingham et al. |
| 6,539,072 | B1 | 3/2003 | Donnelly et al. |
| 6,556,934 | B2 | 4/2003 | Higashide |
| 6,560,716 | B1 | 5/2003 | Gasparik et al. |
| 6,606,041 | B1 | 8/2003 | Johnson |
| 6,606,350 | B2 | 8/2003 | Dress, Jr. et al. |
| 6,606,576 | B2 | 8/2003 | Sessions |
| 6,639,957 | B2 | 10/2003 | Cahill-O'Brien et al. |
| 6,643,787 | B1 | 11/2003 | Zerbe et al. |
| 6,657,468 | B1 | 12/2003 | Best et al. |
| 6,662,305 | B1 | 12/2003 | Salmon et al. |
| 6,690,741 | B1 | 2/2004 | Larrick, Jr. et al. |
| 6,691,214 | B1 | 2/2004 | Li et al. |
| 6,693,918 | B1 | 2/2004 | Dallabetta et al. |
| 6,717,992 | B2 | 4/2004 | Cowie et al. |
| 6,725,304 | B2 | 4/2004 | Arimilli et al. |
| 6,735,709 | B1 | 5/2004 | Lee et al. |
| 6,751,696 | B2 | 6/2004 | Farmwald et al. |
| 6,763,444 | B2 | 7/2004 | Thomann et al. |
| 6,873,939 | B1 | 3/2005 | Zerbe et al. |
| 6,889,357 | B1 | 5/2005 | Keeth et al. |
| 6,920,540 | B2 | 7/2005 | Hampel et al. |
| 6,961,862 | B2 | 11/2005 | Best et al. |
| 7,031,221 | B2 | 4/2006 | Mooney et al. |
| 7,042,914 | B2 | 5/2006 | Zerbe et al. |
| 7,072,355 | B2 | 7/2006 | Kizer |
| 7,076,697 | B2 | 7/2006 | Lee |
| 7,095,789 | B2 | 8/2006 | Ware et al. |
| 7,099,424 | B1 | 8/2006 | Chang et al. |
| 7,119,549 | B2 | 10/2006 | Lee et al. |
| 7,126,986 | B2 | 10/2006 | Dabral et al. |
| 7,137,048 | B2 | 11/2006 | Zerbe et al. |
| 7,159,136 | B2 | 1/2007 | Best et al. |
| 7,175,940 | B2 | 2/2007 | Laidig et al. |
| 7,196,979 | B2 | 3/2007 | Kadlec et al. |
| 7,400,671 | B2 | 7/2008 | Hampel et al. |
| 7,526,664 | B2 | 4/2009 | Abhyankar et al. |
| 7,535,933 | B2 | 5/2009 | Zerbe et al. |
| 7,640,448 | B2 | 12/2009 | Best et al. |
| 8,144,792 | B2 | 3/2012 | Ware et al. |
| 8,504,863 | B2 | 8/2013 | Best et al. |
| 8,761,302 | B1 | 6/2014 | Lee et al. |
| 9,124,390 | B2 | 9/2015 | Best et al. |
| 2001/0048382 | A1 | 12/2001 | Low et al. |
| 2001/0053175 | A1 | 12/2001 | Hector et al. |
| 2001/0056332 | A1 | 12/2001 | Abrosimov et al. |
| 2002/0054648 | A1 | 5/2002 | Krummrich et al. |
| 2002/0066001 | A1 | 5/2002 | Olarig et al. |
| 2002/0066052 | A1 | 5/2002 | Olarig et al. |
| 2002/0072870 | A1 | 6/2002 | Adam et al. |
| 2002/0138224 | A1 | 9/2002 | Sessions |
| 2002/0149824 | A1 | 10/2002 | Beaulieu et al. |
| 2002/0184461 | A1 | 12/2002 | Zumkehr |
| 2003/0026399 | A1 | 2/2003 | Carlson |
| 2003/0063597 | A1 | 4/2003 | Suzuki |

(56) References Cited

U.S. PATENT DOCUMENTS

| | | |
|---|---|---|
| 2003/0065465 A1 | 4/2003 | Johnson et al. |
| 2003/0065845 A1 | 4/2003 | Riley |
| 2003/0087659 A1 | 5/2003 | Wang |
| 2003/0117864 A1 | 6/2003 | Hampel et al. |
| 2003/0131160 A1 | 7/2003 | Hampel et al. |
| 2003/0135775 A1 | 7/2003 | Moon |
| 2003/0146800 A1 | 8/2003 | Dvorak |
| 2003/0149991 A1 | 8/2003 | Reidhead et al. |
| 2003/0158994 A1 | 8/2003 | Moy |
| 2003/0198212 A1 | 10/2003 | Hoctor et al. |
| 2003/0198308 A1 | 10/2003 | Hoctor et al. |
| 2003/0221061 A1 | 11/2003 | El-Batal et al. |
| 2004/0032354 A1 | 2/2004 | Knobel et al. |
| 2004/0054830 A1 | 3/2004 | Craft et al. |
| 2004/0057500 A1 | 3/2004 | Balachandran et al. |
| 2004/0077327 A1 | 4/2004 | Lim et al. |
| 2004/0083070 A1 | 4/2004 | Salmon et al. |
| 2004/0199674 A1 | 10/2004 | Brinkhus |
| 2004/0217881 A1 | 11/2004 | Pedyash et al. |
| 2004/0260858 A1 | 12/2004 | Primrose |
| 2005/0028050 A1 | 2/2005 | Ganry |
| 2005/0071707 A1 | 3/2005 | Hampel |
| 2005/0081942 A1 | 4/2005 | Schwane et al. |
| 2005/0162948 A1* | 7/2005 | Swanson ............... G11C 29/028 365/201 |
| 2005/0163202 A1 | 7/2005 | Hampel et al. |

OTHER PUBLICATIONS

Banu et al., "TA 6.4: A 660Mb/s CMOS Clock Recovery Circuit with Instantaneous Locking for NRZ Data and Burst-Mode Transmission," IEEE International Solid State Circuits Conference, 1993, pp. 102-103, 270. 4 pages.
Cerisola et al., "CORD—a WDM Optical Network: Control Mechanism Using Subcarrier Multiplexing and Novel Synchronization Solutions," 1995 IEEE International Conference, vol. 1, Jun. 18-22, 1995, pp. 261-265. 6 pages.
Chang et al., "A 2 Gb/s Asymmetric Serial Link for High-Bandwidth Packet Switches," Hot Interconnects V, Stanford University, Aug. 1997. 9 pages.
Chang, Kun-Yung, "Design of a CMOS Asymmetric Serial Link," A Dissertation Submitted to the Department of Electrical Engineering and the Committee on Graduate Studies of Stanford University, Aug. 1999. 133 pages.
Chen et al., "A 1.25Gb/s, 460mW CMOS Transceiver for Serial Data Communication," ISSCC97, Session 15, Serial Data Communications, Paper FP 15.3, pp. 242-243, 465, Feb. 7, 1997. 3 pages.
Dally et al., "Digital Systems Engineering," Cambridge University Press, 1998, pp. 447-449. 3 pages.
Dally et al., "Transmitter Equalization for 4-Gbps Signaling," IEEE Micro, vol. 17, No. 1, Jan./Feb. 1997, pp. 48-56. 9 pages.
Daniele et al., "Principle and Motivations of UWB Technology for High Data Rate WPAN Applications," SOC 2003. 4 pages.
Daniele, Norbert, "Ultra Wide Band Principles and Applications for Wireless Communications," CEA-LETI Annual Review, Jun. 25 and 26, 2002. 23 pages.
EIA/JEDEC Standard No. 8-6 (EIA/JESD8-6), "High Speed Transceiver Logic (HSTL) A 1.5 V Output Buffer Supply Voltage Based Interface Standard for Digital Integrated Circuits," Aug. 1995. 16 pages.
EIA/JEDEC Standard No. 8-B (JESD8-B), "Interface Standard for Nominal 3 V/3.3 V Supply Digital Integrated Circuits," Sep. 1999. 10 pages.
Eldering et al., "Digital Burst Mode Clock Recovery Technique for Fiber-Optic Systems," Journal of Lightwave Technology, vol. 12, No. 2, Feb. 1994, pp. 271-279. 12 pages.
EP Examination Report dated Jan. 5, 2015 in EP Application No. 05711973.7. 7 pages.
EP Examination Report dated Nov. 6, 2007 in EP Application No. 05706081.6. 5 pages.

EP Invitation, Official Communication dated May 4, 2011 re EP Application No. 05711973.7. 2 Pages.
EP Office Action dated Nov. 24, 2011 re EP Application No. 05711973.7. 1 Page.
EP Office Action dated Jan. 15, 2010 re EP Application No. 05 711 891.1, includes references cited. 5 pages.
EP Response dated Jan. 9, 2012 to the Official Communication dated Nov. 24, 2011 and to the Supplementary EP Search Report dated Nov. 7, 2011 re EP Application 05711973.7. 1 page.
EP Response dated Apr. 29, 2015 in EP Application No. 05711973. 7, Includes New Claims and New Description pp. 2, 2a, and 29 (Highlighted and Clear copies). 41 pages.
EP Response dated Jun. 29, 2011 to the Official Communication dated May 4, 2011 re EP Application No. 05711973.7. 1 Page.
EP Response dated May 25, 2010 to the Official Communication dated Jan. 15, 2010 re EP Application No. 05711891.1, Includes New claims 1-24 (highlighted and clear copies) and New Description pp. 3, 3a, 3b. 30 pages.
EP Search Report dated Jan. 15, 2010 in EP Application No. 05711891.1. 5 Pages.
EP Supplementary Partial European Search Report dated Nov. 7, 2011 re EP Application No. 05711973.7. 5 Pages.
EP Supplementary Search Report dated Dec. 18, 2007 in EP Patent Application No. 05711891.1. 3 pages.
First CN Office Action dated May 4, 2012 for CN Application No. 200910205259.9. 24 pages.
Gillingham et al., "SLDRAM: High Performance Open-Standard Memory," IEEE Micro, Nov./Dec. 1997, pp. 29-39, vol. 17, No. 6, Institute of Electrical and Electronics Engineers, Inc., Los Alamitos, California. 11 pages.
Gillingham, Peter, "SLDRAM Architectural and Functional Overview," SLDRAM Consortium, Aug. 29, 1997, pp. 1-14. 14 pages.
Hu et al., "A Monolithic480 Mb/s Parallel AGC/Decision/Clock-Recovery Circuit in 1.2-um CMOS," IEEE Journal of Solid-State Circuits, vol. 28, No. 12, Dec. 1993, pp. 1314-1320. 8 pages.
Intel Corporation, "How to Measure RDRAM System Clock Jitter," Application Note AP-667, Jun. 1999, pp. 1-15. 15 pages.
JEDEC Standard (JESD8-16), "Bus Interconnect Logic (BIC) for 1.2 Volts," Apr. 2004. 15 pages.
Kim et al., "An 800Mbps Multi-Channel CMOS Serial Link with 3x Oversampling," IEEE 1995 Custom Integrated Circuits Conference, p. 22.7.1-22.7.4. 4 pages.
Kirihata et al., "A 113mm2 600Mb/s/pin 512 Mb DDR2 SDRAM with vertically-Folded Biltine Architecture," 2001 IEEE International Solid-State Circuit Conference, Session 24. 3 pages.
Lee et al., "TP 15.3: A 90mW 4Gb/s Equalized I/O Circuit with Input Offset Cancellation," IEEE International Solid-State Circuits Conference, Feb. 8, 2000, pp. 252-253. 2 pages.
Lee, Ming-Ju Edward et al., "A90mW Gb/s Equalized I/O Circuit with Input Offset Cancellation," 2000 IEEE International Solid State Circuits Confernce, 3 pages.
Lewis, Dave, "Easy-to-Use LVDS Serdes for the Serdes Neophyte," National Semiconductor, Jun. 16, 2003. 5 pages.
Nakamura et al., "A 6 Gbps CMOS Phase Detecting DEMUX Module Using Half-Frequency Clock," 1998 Symposium on VLSI Circuits Digest of Technical Papers, pp. 196-197. 2 pages.
Nakase et al., "Source-Synchronization and Timing Vernier Techniques for 1.2 GB/s SLDRAM Interface," IEEE Journal of Solid-State Circuits, vol. 34, No. 4, Apr. 1999, pp. 494-501. 8 pages.
Paris et al., "WP 24.3: A 800 MB/s 72 Mb SLDRAM with Digitally-Calibrated DLL," ISSCC, 0-7803-5129-0/99, Slide Supplement, IEEE, 1999. 10 pages.
Poulton et al., "A Tracking Clock Recovery Receiver for 4Gb/s Signaling," Hot Interconnects '97, Aug. 21-23, 1997, Palo Alto, CA, pp. 1-13. 14 pages.
Rambus Inc., "Direct Rambus Long Channel Design Guide," 2000. 48 pages.
Rambus Inc., "Direct Rambus Short Channel Layout Guide," Version 0.95, Aug. 2001. 52 pages.
Rambus, Inc. "RDRAM Direct Rambus Clock Generator," Apr. 2002. 22 pages.
RaSer™ X Product Brief, "Highly Flexible 10 Gbps Backplane Serial Link Interface," Copyright 2003, Rambus, Inc. 2 pages.

(56) References Cited

OTHER PUBLICATIONS

RDRAM® Overview, "High Performance Memory Interface Solution," Copyright 2003, Rambus, Inc. 4 pages.
Redwood Technology Brief, "High Performance Parallel Bus Interface Technology," Copyright 2003, Rambus, Inc. 2 pages.
SLDRAM Inc., "SLD4M18DR400 4 Meg X 18 SLDRAM: 400 Mb/s/pin SLDRAM 4 M x 18 SLDRAM Pipelined, Eight Bank, 2.5 V Operation," Jul. 9, 1998. 69 pages.
Supplementary EP Search Report dated Apr. 17, 2007 in EP Application No. 05706081.6. 3 pages.
TW Office Action and IPO Search Report with search completion date of Jun. 9, 2012 re TW Application No. 094101309. 12 pages.
TW Office Action dated May 11, 2011 re TW Application No. 094101310. 13 pages.
Widmer et al., "Single-Chip 4×500-MBd CMOS Transceiver," IEEE Journal of Solid-State Circuits, vol. 31, No. 12, Dec. 1996, pp. 2004-2014. 11 pages.
Widmer, et al., "A DC-Balanced, Partitioned-Block, 8B/10B Transmission Code," IBM J. Res. Develop., vol. 27, No. 5, Sep. 1983, pp. 440-451. 12 pages.
Win et al., "Impulse Radio: How It Works," IEEE Communications Letters 2, vol. 2, Feb. 1998, pp. 36-38. 3 pages.
Yang, Chih-Kong Ken, "Design of High-Speed Serial Links in CMOS," Technical Report No. CSL-TR-98-775, Dec. 1998, pp. 1-182. 94 pages.
Yellowstone Technology Brief, "High Performance Memory Interface Technology," Copyright 2003, Rambus, Inc. 2 pages.

* cited by examiner

DRIFT TRACKING FEEDBACK FOR COMMUNICATION CHANNELS

RELATED APPLICATIONS

This application is a continuation of U.S. patent application Ser. No. 16/707,957, filed on Dec. 9, 2019, which is a continuation of U.S. patent application Ser. No. 15/616,795, filed on Jun. 7, 2017, now U.S. Pat. No. 10,503,201, issued on Dec. 10, 2019, which is a continuation of U.S. patent application Ser. No. 14/751,312, filed on Jun. 26, 2015, now U.S. Pat. No. 9,710,011, issued on Jul. 18, 2017, which is a continuation of U.S. patent application Ser. No. 13/949,101, filed Jul. 23, 2013, now U.S. Pat. No. 9,124,390, issued on Sep. 1, 2015, which is a continuation of U.S. patent application Ser. No. 12/619,076, filed Nov. 16, 2009, now U.S. Pat. No. 8,504,863, issued on Aug. 6, 2013, which is a continuation of U.S. patent application Ser. No. 11/744,006, filed May 3, 2007, now U.S. Pat. No. 7,640,448, issued on Dec. 29, 2009, which is a continuation of U.S. patent application Ser. No. 11/560,031, filed Nov. 15, 2006, now U.S. Pat. No. 7,526,664, issued on Apr. 28, 2009, which is a continuation of U.S. patent application Ser. No. 11/243,032, filed Oct. 4, 2005, U.S. Pat. No. 7,159,136, issued on Jan. 2, 2007, which is a continuation of U.S. patent application Ser. No. 10/802,634, filed Mar. 17, 2004, now U.S. Pat. No. 6,961,862, issued on Nov. 1, 2005, which are all hereby incorporated by reference in entirety.

BACKGROUND

Field

The present invention relates to the calibration of communication channel parameters in systems, including mesochronous systems, in which two (or more) components communicate via an interconnection link; and to the calibration needed to account for drift of conditions related to such parameters during operation of the communication channels.

Description of Related Art

In high-speed communication channels, including channels which are operated in a mesochronous manner, a transmitter and receiver are each locked to a specific phase relative to some global reference clock. The phase values of the transmitter and receiver which minimize the bit-error-rate of the communication channel may be determined in a number of ways. However, once these phase values are set, offsets due to system conditions (such as temperature effects on the propagation time of the wires in the link) will cause the chosen phase values to become non-optimal. Other parameters of the communication channel also drift due to changing system conditions.

It is therefore desirable to provide techniques to detect and compensate for the drift in parameters of a communication channel due to changing system conditions like these.

SUMMARY

The present invention provides a system and method for setting a parameter of a communication channel, which allows for optimizing the parameter while efficiently tracking drift of properties of the channel. A communication channel includes a first component having a transmitter coupled to a normal signal source, and a second component having a receiver coupled to a normal signal destination. A communication link couples the first and second components. The communication system provides for setting an operation value for the parameter, which for example can include executing an exhaustive calibration sequence at initialization of the channel. The method and system of the present invention provides for tracking drift in the parameter by monitoring a signal on another channel that is characterized by drift relative to a reference, such as a reference clock, in amounts that correlate with drift in the parameter of communication channel relative to the reference, and to update, or indicate the need for updating, the operation value of the parameter in response to the monitoring function. The signal being monitored is provided in various ways according to embodiments of the invention, including by signals on channels that emulate the channel being monitored, by signals on another channel within a single communication bus, by signals on a channel that loops back to a component on the channel that generates it, or by signals that otherwise exhibit characteristics that correlate, whether causally or not, to the parameter being tracked on the channel.

In embodiments of the invention, the parameter is updated by executing a calibration sequence on the communication link. In other embodiments, the updating includes adjusting the operation value of the parameter as a function of the drift determined by monitoring the signal.

According to embodiments of the present invention, the parameter of the communication channel is the phase of one of the receive and transmit clocks for an input/output driver, where the phase establishes a sample timing point for a receiver, or a drive timing point for a transmitter. The monitoring function operates by comparing the phase of the signal with the phase of a reference clock. Because the signal being monitored drifts in phase by amounts that correlate with the drift in phase of the sample timing point or drive timing point of communication channel being adjusted, the relative phase changes can be relied upon to indicate the need for updating the operation value of the parameter.

The signal being monitored in order to track drift in various embodiments comprises a data transmission signal, for example, on another communication channel. The monitoring step, in some embodiments, includes detecting transitions in the data transmission, and comparing the detected transitions with transitions in the reference clock. In other embodiments, the monitored signal comprises a control signal used for controlling communications in the communication channel, such as a data strobe between the components using the communication channel. In yet other embodiments, the monitored signal comprises a signal taken from outside the communication channel that nonetheless can be relied upon for emulating drift in the parameter.

The invention is also embodied by an apparatus coupled with a driver for a communication channel. The apparatus includes memory to store the operation value of the parameter, logic to monitor a signal which has a characteristic that correlates with the parameter of the communication channel to track drift in the characteristic, and logic to indicate the need to update, or to update directly, the operation value based on the drift in the monitored signal.

An embodiment of the present invention comprises an interface for a communication bus. The interface includes a plurality of input/output drivers coupled with respective bidirectional links in the communication bus. The input/output drivers include a transmitter responsive to a transmit clock, which drives a signal on a corresponding link in the communication bus. Also, a receiver is included in the input/output driver, that is responsive to a receive clock. The receiver samples a signal on the corresponding link. A transmit clock generator and a receive clock generator are coupled respectively to the transmitter and the receiver, and to a reference clock. At least one of the transmit clock generator and the receive clock generator is adjustable in response to a phase control signal. The interface also includes a drift tracking circuit. The drift tracking circuit is coupled to a link carrying a monitored signal that is characterized by drift that correlates with drift in the communication bus. The drift tracking circuit includes a tracking clock generator that is coupled to the reference clock and generates a tracking clock. A phase detector is included in the drift tracking circuit, to track changes in phase between the tracking clock and transitions in the monitored signal. Logic in the drift tracking circuit monitors the changes in phase, and issues an indication that the phase control signal be updated to account for the changes in phase.

The receive clock generator and the transmit clock generator in some embodiments of the interface comprise a phase locked loop, coupled to the reference clock, which produces a set of output clocks that are some multiple of the input reference frequency. A mixer is coupled with the phase locked loop, and is responsive to the phase control signal to generate the transmit or receive clock, having an adjustable phase as indicated by the phase control signal. Also, memory coupled with the clock generator stores the phase control signal.

In yet other embodiments of the interface, calibration logic is included to determine the operation value of the phase control signal. The calibration logic is responsive to the indication from the drift tracking circuit, to re-calibrate the operation value of the phase control signal. Also, the calibration logic may be executed to initially set the operation value of the phase control signal, for example at startup of the interface.

Accordingly, the present invention provides for drift tracking based on data collected during normal operation of a communication channel, without relying upon periodic calibration sequences that remove the communication channel from its mission function. Thus, the present invention tracks drift of parameters of the communication channel, including mesochronous channels, while preserving overall throughput and latency characteristics of the link. The present invention is particularly suited to high speed communication channels, including chip-to-chip channels with links across traces on printed circuit boards, or other board level media, operating with system clocks over 100 MegaHertz, including clocks with frequencies in the range of 400 MegaHertz, and higher.

Other aspects and advantages of the present invention can be seen on review of the drawings, the detailed description and the claims, which follow.

DETAILED DESCRIPTION

A detailed description of embodiments of the present invention is provided with reference to the Figures.

Figure 1:
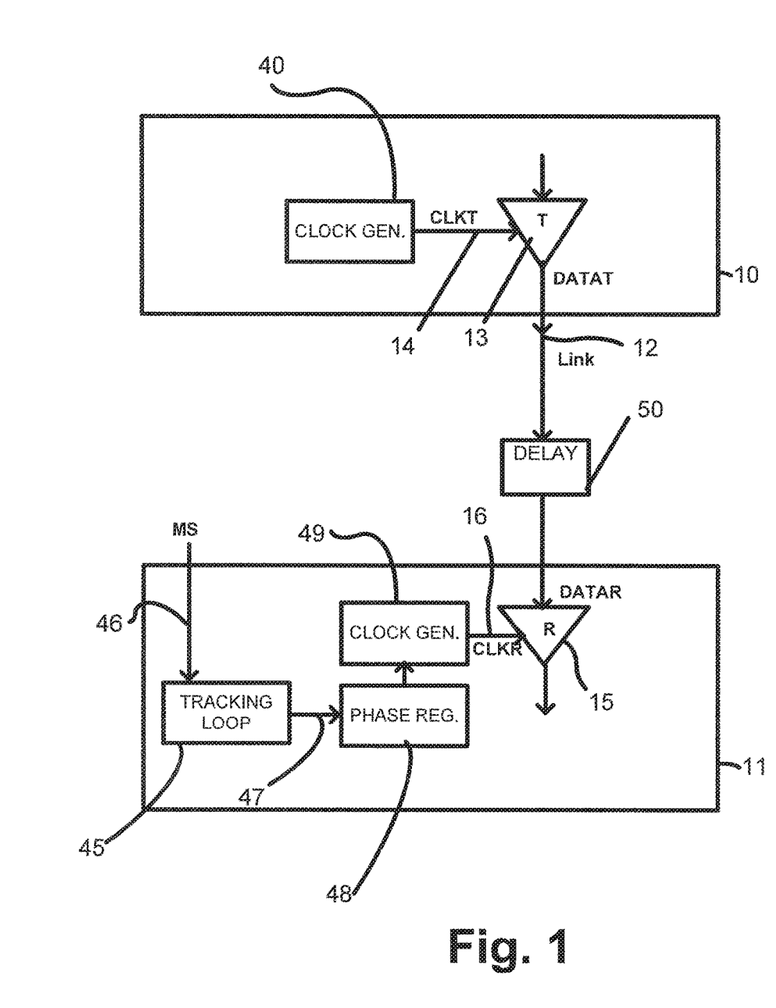
FIG. 1 is a simplified diagram of two components interconnected by a communication channel, with drift tracking according to an embodiment of the present invention.

FIG. 1 shows two components 10, 11 connected with an interconnection medium, referred to as link 12. Component 10 has a transmitter circuit 13 which drives symbols (bits) on link 12 in response to timing events on the internal CLKT signal 14. This series of bits forms signal DATAT. Component 11 has a receiver circuit 15 which samples symbols (bits) on link 12 in response to timing events on the internal CLKR signal 16. The DATAT forms signal DATAR at the opposite end of the link, which is sampled by the receiver. The transmit clock CLKT is generated by a transmit clock generator 40. The receive clock CLKR is generated by a receive clock generator 49 that is responsive to a phase control signal stored in a phase calibration register 48. A communication channel between the components 10 and 11 comprises the transmitter circuit 13, the link 12 and the receiver circuit 15. Delay block 50 in the link 12 represents delay encountered in the communication channel, which may drift during operation due to changing operational and environmental conditions in the components and in the link. For successful data transmission, the relative phases of the transmit clock CLKT and the receive clock CLKR must account for the delay represented by block 50. As the delay represented by block 50 drifts, the relative phases of the transmit clock CLKT and the receive clock CLKR must also be adjusted in order to maintain successful data transmission.

A tracking circuit 45 on component 11 is coupled to a monitored signal MS on line 46. Line 46 represents a channel, which has a characteristic, such as the drift in phase, which correlates with drift in delay 50 in the communication channel across link 12. The tracking circuit 45 generates an indication on line 47 used to control the value in the phase register 48, which is coupled to the receive clock generator 49. The indication is generated when the drift in the monitored signal on line 46 reaches a predetermined level in some embodiments. In one embodiment, the tracking circuit 45 generates the indication on line 47 on each phase change of the monitored signal, and adjusts the phase control signal in phase register 48 in response to a function of the phase changes indicated by the drift tracking circuit 45. In another alternative, the indication on line 47 is provided to calibration resources, such as special purpose logic, a host processor executing calibration routines, or other resources, which execute a calibration sequence for the link 12 to update the phase control signal in phase register 48.

Figure 2:
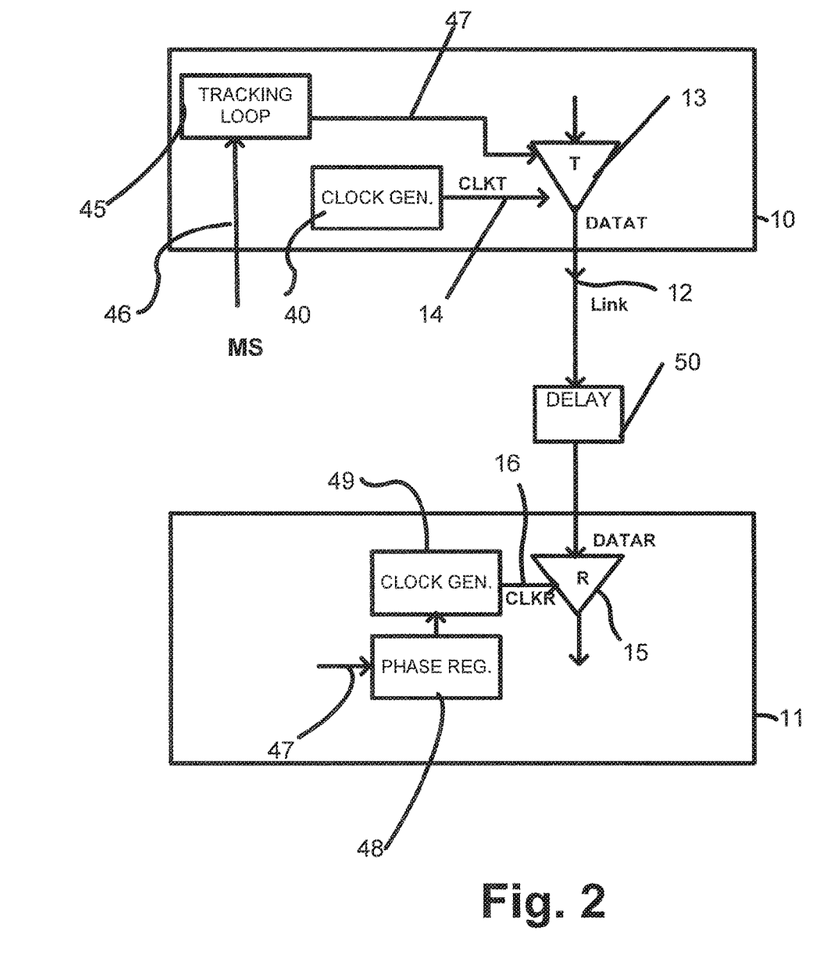
FIG. 2 is a simplified diagram of two components interconnected by a communication channel, with drift tracking according to another embodiment of the present invention.

In the embodiment of FIG. 1, the tracking circuit is on the receive side of the channel. In alternative embodiments, the tracking circuit is implemented on the transmit side of the channel, or on both the transmit and the receive sides of the channel. FIG. 2 illustrates an embodiment with drift tracking for a parameter of a transmitter in a communication channel between first and second components. Thus, FIG. 2 shows two components 10, 11 connected with an interconnection medium, referred to as link 12. Component 10 has a transmitter circuit 13 which drives symbols (bits) on link 12 in response to timing events on the internal CLKT signal 14. This series of bits forms signal DATAT. Component 11 has a receiver circuit 15 which samples symbols (bits) on link 12 in response to timing events on the internal CLKR signal 16. This series of bits forms signal DATAR. The transmit clock CLKT is generated by a transmit clock generator 40. The receive clock CLKR is generated by a receive clock generator 49. A communication channel between the components 10 and 11 comprises the transmitter circuit 13, the link 12 and the receiver circuit 15. Delay block 50 in the link 12 represents delay encountered in the communication channel, which may drift during operation due to changing operational and environmental conditions in the components and in the link. For successful data transmission, the relative timing for the communication channel is determined by the phase of the transmit clock CLKT and the phase of the receive clock CLKR. The difference in phase between the two clocks is absorbed by the delay represented by delay block 50.

A tracking circuit 45 on component 10 is coupled to a monitored signal MS on line 46. Line 46 represents a channel, which has a characteristic such as the drift in phase that correlates with drift of a parameter in the communication channel across link 12. The tracking circuit 45 generates an indication on line 47 used to control the transmit timing, which is coupled to the transmitter circuit 13. The indication is generated when the drift in the monitored signal on line 46 reaches a predetermined level in some embodiments.

Figure 3:
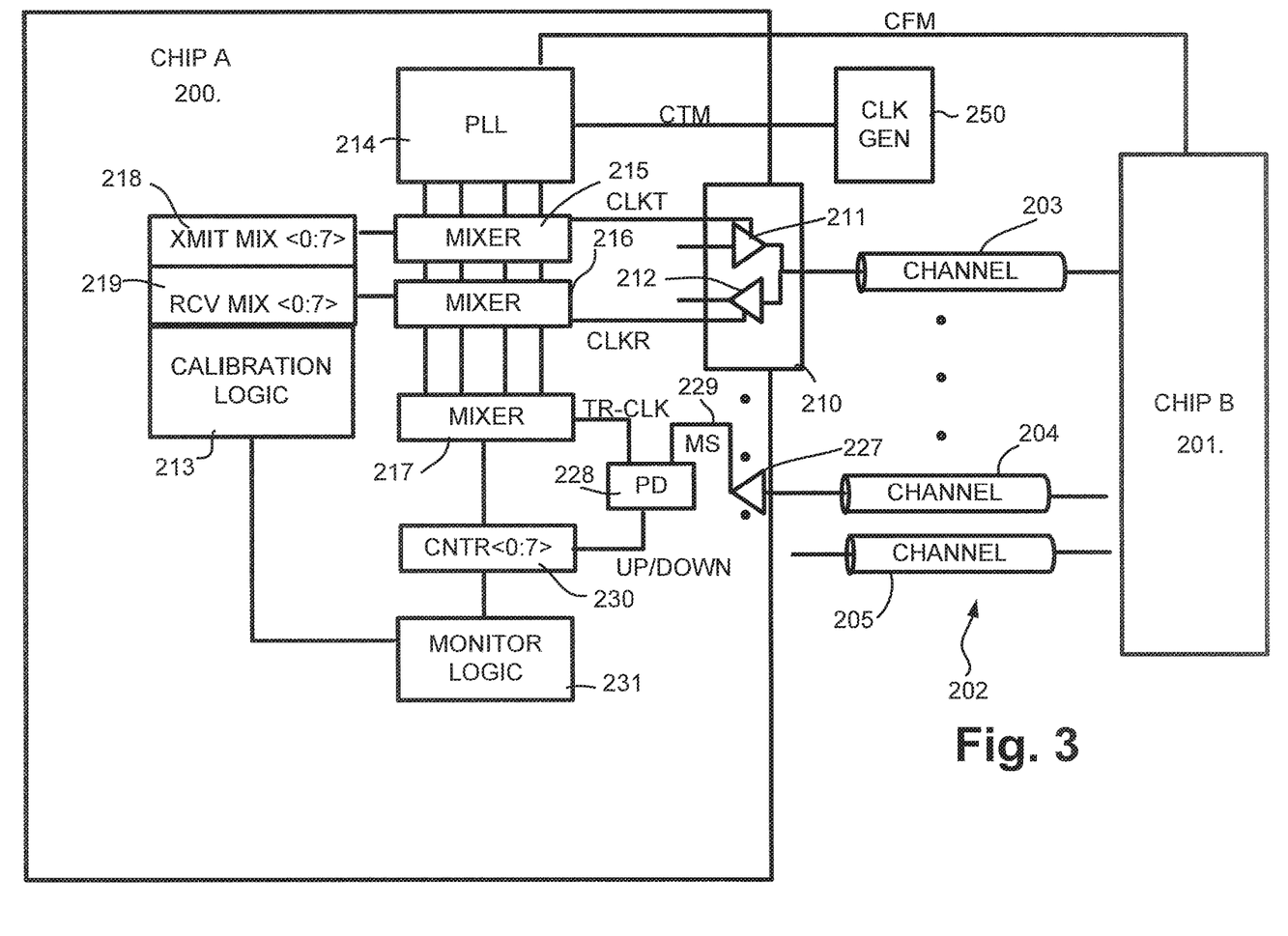
FIG. 3 illustrates an embodiment of an interface to a communication channel, including input/output drivers and a drift tracking circuit according to the present invention.

FIG. 3 illustrates a system including a first integrated circuit 200 and a second integrated circuit 201 which communicate via a communication bus, generally 202. In the system of FIG. 3, a clock generator 250 is included, which provides a reference clock to the master CTM on the first integrated circuit 200. The first integrated circuit 200, in this example provides the reference clock from the master CFM to the second integrated circuit 201.

The communication bus includes a plurality of communication channels that comprises a transmitter, a communication link and a receiver. For example, the communication bus includes a plurality of bi-directional data links represented by line 203, a plurality of bi-directional address links represented by line 204, and a plurality of bi-directional control links represented by line 205. In other embodiments, the communication bus comprises multidrop links, uni-directional links, or combinations of multidrop, uni-directional and bi-directional links.

The first integrated circuit 200 and the second integrated circuit 201 include interface circuits supporting the communication bus. For simplicity, an interface circuit for one of the bi-directional data links 203 on the communication bus is shown.

The interface includes an input/output driver 210. The input/output driver includes a transmitter 211 and a receiver 212. The transmitter 211 accepts input from a normal path used for the mission function of the first integrated circuit 200 and drives the corresponding data on the communication link 203. A transmit clock CLKT is coupled to the transmitter 211 and sets a drive timing point. A receiver (not shown) on the second integrated circuit 201 samples the data from the line 203 in response to a corresponding receive clock. The drive timing point on the transmitter 211 is set by calibration logic 213, using for example a calibration routine as described below, so that the receiver on the second integrated circuit 201 is able to capture correct data.

Likewise, a receive clock CLKR is coupled to the receiver 212, and sets a sample timing point. The sample timing point is set by the calibration logic 213, in cooperation with a transmitter (not shown) on the second integrated circuit 201 in exemplary embodiments.

The transmit clock and the receive clock are produced by clock generator circuits. The clock generator circuits include a phase locked loop 214, which produces a set of reference clocks, and supplies those clocks to mixers 215, 216, 217 in the interface. The mixer 215 is used for generating the transmit clock in response to a mixer control signal stored in register 218. The mixer 216 is used for generating the receive clock in response to a mixer control signal stored in register 219. In the illustrated embodiment, registers 218 and 219 are managed by the calibration logic 213. In alternative embodiments, the registers could be managed by higher-layer circuits which implement the equivalent of the calibration logic 213 in software.

The mixer 217 is used for generating a tracking clock TR-CLK, which is also based on the reference clock CTM so that tracking relative to the tracking clock TR-CLK is, thereby, tracking relative to the reference clock CTM in some embodiments. The tracking clock TR-CLK is supplied to a phase detector 228, which also receives as input a monitored signal from another channel 204 on the communication bus. In this example, the monitored signal is supplied on line 229 from the input to the receiver 227. The phase detector 228 includes a transition detector, so that transitions in the monitored signal and transitions in the tracking clock are utilized for detecting shifts in phase of the monitored signal. The output of the phase detector 228 is supplied to a counter 230, which counts up and counts down to follow shifts in phase. The output of the counter 230 is used as a phase control signal for the mixer 217. Monitor logic 231 is coupled to the counter 230, and issues indications to the calibration logic 213, in response to changes in the counter value.

Input/output drivers, like driver 210, are coupled to each of the links in the communication bus. The tracking circuit including the mixer 217, the phase detector 228, and the counter 230, can be repeated for each input/output driver, or shared amongst sets of input/output drivers on the communication bus, or shared among all the links on the bus, depending on level of accuracy needed, the environment of operation for the particular implementation, and other trade-offs.

The calibration logic 213 may include additional registers, such as registers storing edge values for use during calibration routines as described below, in addition to registers storing the operation value for each of the clocks. The registers 218 and 219 are loaded by the calibration logic 213 depending on the mode of operation.

Accordingly, the system shown in FIG. 3 performs timing calibration during normal communication between integrated circuits in the system. The calibration of read and write clocks in the integrated circuits may be executed without affecting the normal communication between the integrated circuits. In the embodiment shown, the system includes a clock-data recovery loop which tracks drift by locking itself to an arriving monitored signal, such as read data sent from another integrated circuit device. Based on this clock-data recovery loop, timing correction of the sample clock used to receive data, and the drive timing clock used to transmit data, may be derived.

According to the present invention, long-term variances in system timing parameters, such as time-of-flight of a data signal, can be detected. Based on this detection, various timing calibration adjustment processes can be initiated. For example, the present invention can be designed so that changes in phase in the tracking circuit of more than a threshold, for example changes of 10 percent, from the state recorded during an initial calibration, result in generation of an indication to the calibration logic that a re-calibration sequence should be executed. Alternatively, when the phase of the tracking clock is shifted by a threshold amount, a compensating adjustment could be made to the phase control values for the input/output driver being monitored.

Figure 4:
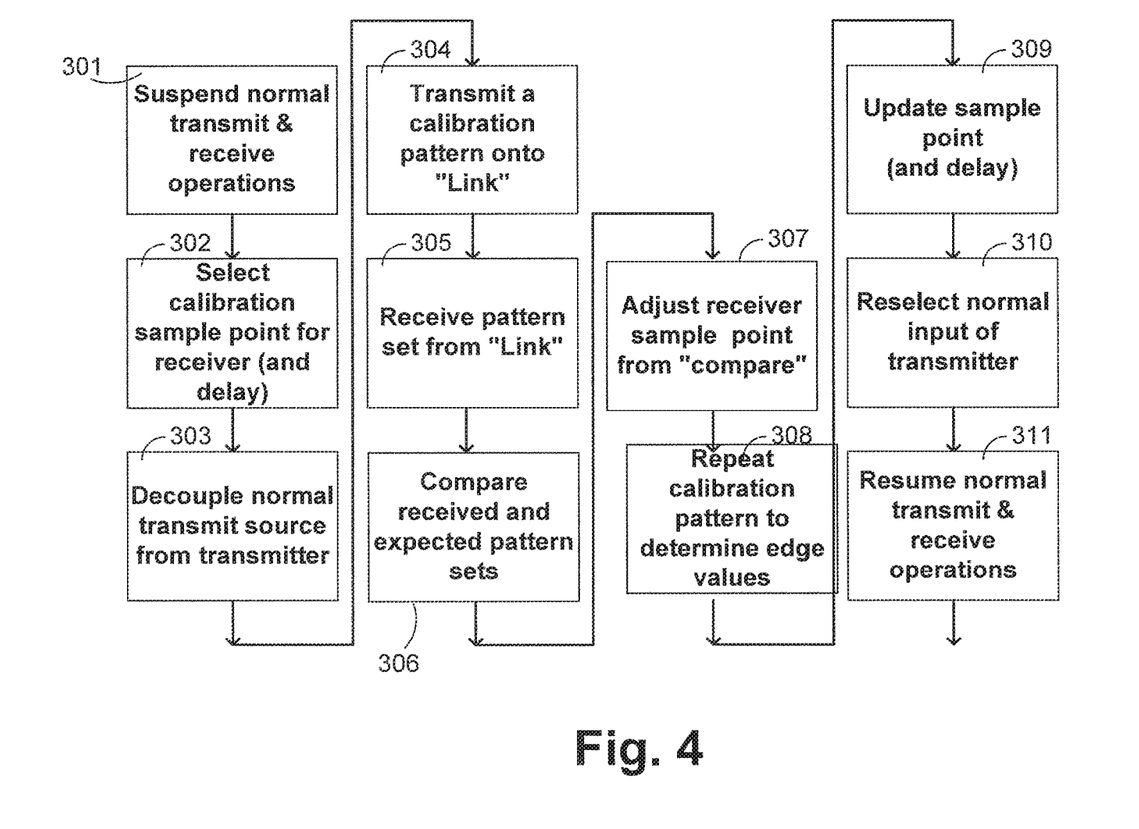
FIG. 4 is a flow chart of operation of calibration logic used to set the operation value of the parameter of the communication channel in some embodiments of the present invention.

FIG. 4 shows calibration steps executed by calibration logic in one exemplary embodiment of the invention, which is suitable for use in combination with the drift tracking circuit described above, in some embodiments to set up initial operation values of the parameters, to periodically update the operation values in response to indications from the drift tracking circuits, or to otherwise supplement the drift tracking circuit.

(Step 301) On initialization, or upon an indication from a drift tracking circuit that a drift measurement is due, suspend transmit and receive operations that are in progress.

(Step 302) Change the sample point of the receiver component from the normal operation value (used for normal operations) to a value used for calibration operations, such as an edge value representing an edge of a timing window for successful reception. It may be necessary to impose a settling delay at this step to allow the new drive point to become stable.

(Step 303) Decouple the transmitter from the normal data path.

(Step 304) Create and transmit a pattern onto the "link." Note that the drive point of the transmitter is fixed relative to the reference clock of the system and is not adjusted.

(Step 305) The pattern set is received in the receive component using the calibration value of the sample point.

(Step 306) The received pattern set is compared to an expected pattern set produced in the receive component. The two pattern sets will either match or not match. As a result of this comparison (and possibly other previous comparisons) a pass or fail determination will be made.

(Step 307) Adjust the sample point operation value in the receiver component as a result of the pass or fail determination.

(Step 308) Repeat steps 302-307 to locate edge values in phase for the sample point outside of which the calibration pattern is not successfully received.

(Step 309) Change the sample point of the receiver to a new operation value (used for normal operations). It may be necessary to impose a settling delay at this step to allow the new drive point to become stable.

(Step 310) Reselect the "normal path" input of the transmitter.

(Step 311) Resume normal transmit and receive operations.

Figure 5:
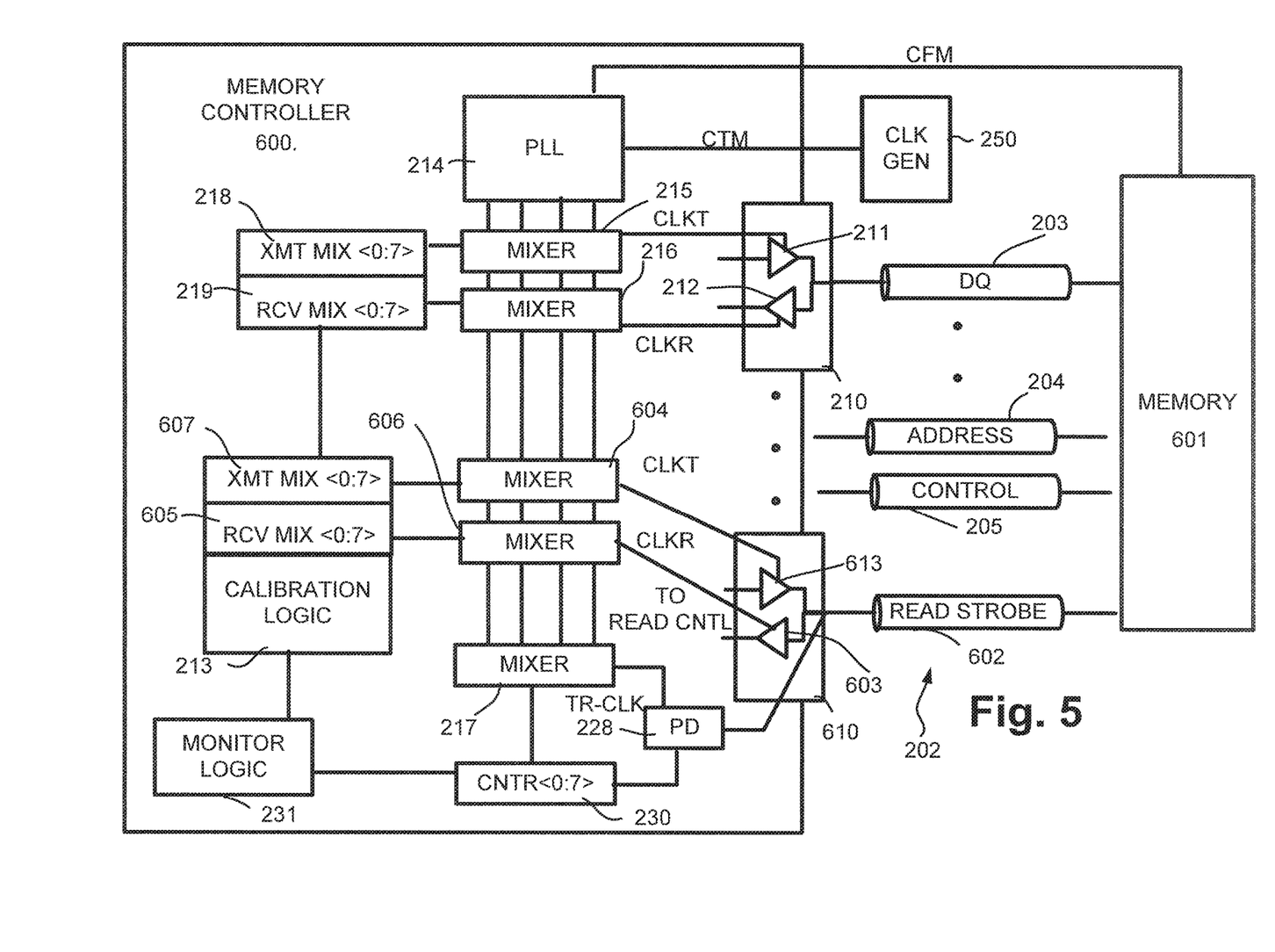
FIG. 5 illustrates an embodiment of an interface to a communication channel between a memory controller and a memory, such as a DRAM, including input/output drivers and a drift tracking circuit according to the present invention with data strobe monitoring.

FIG. 5 illustrates an embodiment of the present invention for a communication channel 203 between a first chip 600 which may be a memory controller as labeled in the drawing, and a second chip 601 which may be a memory like a double data rate DDR dynamic random access memory DRAM as labeled in the drawing, that provides a DQS data strobe signal during read operations. The reference numerals in FIG. 5 are the same as those for components of FIG. 3, with the exception of items relating to the data strobe channel 602. Other components of FIG. 5 are not described again, as they correspond with like numbered components of FIG. 3. In one advantageous embodiment of FIG. 5, the monitored signal for the drift tracking circuit comprises the DQS data strobe control signal produced by the DDR DRAM during read operations (or other data strobe signals or other control signals as appropriate for a particular implementation), and received in data strobe I/O 610 by receiver 603 and provided to read control logic (not shown). The monitor logic 231 is configured to monitor the received read strobe, the transmitted read strobe, or both. When it is configured to track drift from both transmitted read strobes and received read strobes, the logic includes mode control to switch between the two modes. In these embodiments, the monitor function can use shared resources to track drift in the local transmitter, and drift in the combination of the transmission line and the remote transmitter. Of course the shared resource embodiment can be applied to other types of monitored signals.

Also, the data strobe I/O has calibrated transmit and receive clocks, generated by mixers 604 and 606 respectively, in response to operation value parameters stored in registers 605 and 607.

Figure 6:
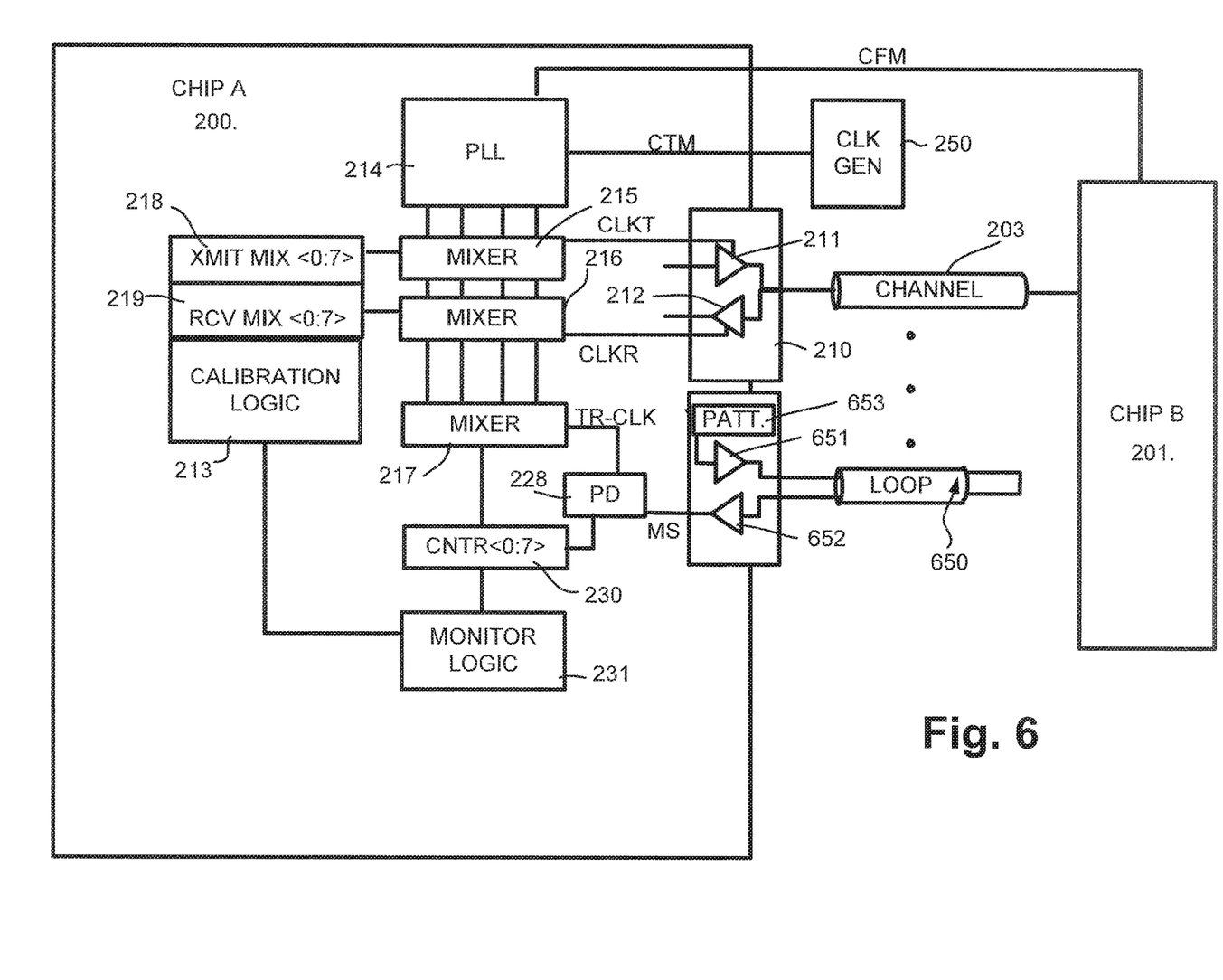
FIG. 6 illustrates an embodiment of an interface to a communication channel between first and second chips, including input/output drivers and a drift tracking circuit according to the present invention including a loop back channel carrying a monitored signal.

FIG. 6 illustrates an embodiment of the present invention for a communication channel 203 between a first chip 200 and a second chip 201, where the monitored signal is provided on a loop back link 650. The reference numerals in FIG. 6 are the same as those for components of FIG. 3, with the exception of the loop back channel including the link 650, the monitored signal transmitter 651, the pattern source 653, and the monitored signal receiver 652. Other components of FIG. 6 are not described again, as they correspond with like numbered components of FIG. 3. In the embodiment shown, a pattern source 653 is coupled to the transmitter 651. The transmitter transmits the pattern, and the receiver receives the looped back pattern. The monitor logic 231 tracks changes in the phase of the looped back pattern. The pattern source 653 can be replaced by any available signal on the chip 200, such as the CTM reference clock, that has transition density or other characteristics making it suitable for use in tracking drift.

The link 650 is implemented in some implementations using the same transmission line design as used for the links 203 of the communication channels being adjusted. For example, the chip-to-chip bus is implemented using printed circuit board traces optimized for frequency, length, amplitude of the signal and other parameters. The loop back channel 650 uses the same or similar printed circuit board trace technology, and has a length of for example one-half the average length of the traces forming the channels in the bus, so that the round trip time of flight is close to the time of flight for signals on the bus.

In one advantageous embodiment of FIG. 6, the loop back channel comprises a transmitter 651 and a link 650 which emulate behavior of the transmitter 211 and link 203 of the communication channel being adjusted. Thus, the looped back signal being monitored from the receiver 652 tracks the behavior of a loop back transmitter 651 on the same chip as the transmitter 211 being adjusted. In other embodiments described above, the transmitter driving the monitored signal is located on a remote chip. Also, in embodiments like that of FIG. 6, the step 301 shown in FIG. 3 may not be necessary during period calibration operations, if the periodic calibration operations are performed using the loop back channel.

In the embodiments described above, a communication channel is provided having an additional phase mixer, which generates a tracking clock, coupled to a phase detector. The phase detector circuit compares the alignment between the tracking clock and a monitored signal. The monitored signal can consist of either a looped back clock signal, a signal from the memory chip on the opposite end of the communication channel, one of the data bits transmitted on the channel, one of the control bits or address bits transmitted on the channel, or any other signal which correlates with the drift on the communication channel. The tracking circuit, which consists basically of a clock-data recovery control block for systems tracking timing parameters, processes the output of the phase detector and affects adjustments in a counter plus register circuit which controls the phase mixer that generates the tracking clock. A monitor circuit periodically compares the current value stored in the register, with previous values, and generates outputs based on that comparison. This output can be used simply to indicate that a re-calibration is required, or for real-time adjustment of the operation value of the parameter being monitored.

According to the present invention, communication systems are provided that track drift, while conserving resources of the communication channels being calibrated. The invention reduces the hardware and storage requirements needed for calibration, reduces the impact on bandwidth and throughput across the communication channel, and maintains accuracy of the operation values of the parameters being calibrated while using less of the resources of the communication channel. Also, the techniques of the present invention improve overall latency characteristics of the communication channel in changing operating conditions.

A method for calibrating a communication channel, including a first component, a second component, and a communication link coupling the first and second components, the communication channel having a parameter with an operation value is described, comprising: setting the operation value of the parameter of the communication channel in one of the first and second components; distributing a reference clock signal to the first and second components; monitoring, using monitor circuits in one of the first and second components, a signal from a medium outside the communication channel, the signal having a characteristic which drifts relative to the reference clock signal at said monitor circuits by amounts that correlate with drift of the parameter of the communication channel, to track the amounts of drift in the characteristic; and in response to the monitoring, updating the operation value based on the amounts of drift in the characteristic of the signal In embodiments of such method, said updating includes executing a calibration sequence.

In embodiments of such method, said updating includes adjusting the operation value as a function of the amounts of drift.

In embodiments of such method, monitoring includes comparing a phase of the reference clock signal with a phase of said signal.

In embodiments of such method, said signal comprises a data signal transmission in another communication channel between the first and second components, and said monitoring includes recovering a clock from the data transmission, and comparing said clock with the reference clock signal.

In embodiments of such method, said signal comprises a control signal transmission in another communication channel between the first and second components.

In embodiments of such method, the parameter comprises a drive timing point for a transmitter on the first component.

In embodiments of such method, the monitoring circuits are on the first component, and the parameter comprises a drive timing point for a transmitter on the first component.

In embodiments of such method, the monitoring circuits are on the first component, and the parameter comprises a sample timing point for a receiver on the second component.

In embodiments of such method, the monitoring circuits are on the first component, and the monitored signal is transmitted by the second component.

In embodiments of such method, the monitoring circuits are on the first component, and the monitored signal is transmitted by the first component.

In embodiments of such method, the monitoring circuits are configured for monitoring first signals transmitted by the first component and second signals by the second component, and including logic to select the monitored signal from one of the first signals and second signals An apparatus coupled with a communication channel, the channel including a first component, a second component, and a communication link coupling the first and second components, the communication channel having a parameter with an operation value is described, comprising: memory in one of the first and second components to store the operation value of the parameter of the communication channel; a reference clock; monitor logic in one of the first and second components to monitor a signal outside the communication channel, that has a characteristic which drifts relative to the reference clock by amounts that correlate with drift of the parameter of the communication channel relative to the reference clock, to track the amounts of drift in the characteristic; and logic, responsive to the monitoring, to update the operation value based on the amounts of drift.

In embodiments of such apparatus, said logic to update includes logic to execute a calibration sequence.

In embodiments of such apparatus, said logic to update includes logic to adjust the operation value as a function of the drift.

In embodiments of such apparatus, said monitor logic includes a phase comparator to compare a phase of the reference clock with a phase of the signal.

In embodiments of such apparatus, said signal comprises a data signal transmission in another communication channel, and said logic to monitor includes a data/clock recovery circuit to recover a clock from the data transmission in the other communication channel, and to compare said clock with a reference clock signal.

In embodiments of such apparatus, said signal comprises a control signal transmission in the communication channel.

In embodiments of such apparatus, the parameter comprises a drive timing point for the transmitter on the first component.

In embodiments of such apparatus, the parameter comprises a sample timing point for the receiver on the second component.

In embodiments of such apparatus, logic is included to execute a calibration sequence to determine the operation value, and store the operation value in said memory.

In embodiments of such apparatus, said communication channel comprises one of a plurality of communication channels of a communication bus, and said signal is carried on a communication channel that comprises one of plurality of communication channels in the communication bus.

In embodiments of such apparatus, said communication channel comprises one of a plurality of communication channels of a communication bus, and said signal is carried on a communication channel that comprises another one of plurality of communication channels in the communication bus, and the signal comprises a data strobe.

In embodiments of such apparatus, said communication channel comprises one of a plurality of communication channels of a communication bus, and the signal is carried on a communication channel that comprises another one of plurality of communication channels in the communication bus, and the signal comprises a timing reference signal generated by one of the first and second components on the communication channel.

In embodiments of such apparatus, the monitoring logic is on the first component, and the monitored signal is transmitted by the second component.

In embodiments of such apparatus, the monitoring logic is on the first component, and the monitored signal is transmitted by the first component.

In embodiments of such apparatus, the monitoring logic is configured for monitoring first signals transmitted by the first component and second signals by the second component; and including logic is configured to select the monitored signal from one of the first signals and second signals.

An interface for a communication bus is described, comprising: a plurality of input/output drivers coupled with respective bi-directional links in the communication bus, the input/output drivers including a transmitter, responsive to a transmit clock, which drives a signal on a corresponding link in the communication bus; a receiver, responsive to a receive clock, which samples a signal on the corresponding link; a transmit clock generator coupled to the transmitter and to a reference clock having a frequency over 100 MegaHertz, which generates the transmit clock; a receive clock generator coupled to the receiver and to the reference clock, which generates the receive clock, wherein at least one of the transmit clock generator and the receive clock generator is adjustable in response to a phase control signal; and a drift tracking circuit, coupled to a link carrying a monitored signal that is characterized by drift relative to the reference clock that correlates with drift of parameters in the communication bus relative to the reference clock, the drift tracking circuit including a phase detector to track changes in phase between the reference clock and the monitored signal, and logic to monitor the changes in phase, and issue an indication that the phase control signal, for said at least one of the transmit clock generator and the receive clock generator, be updated to account for the changes in phase.

In embodiments of such interface, said link carrying a monitored signal comprises one of the links in the communication bus and the monitored signal comprises a data strobe on the link.

In embodiments of such interface, said link carrying a monitored signal comprises one of the links in the communication bus and the monitored signal comprises a timing reference signal generated by a device coupled to the link.

In embodiments of such interface, said link carrying a monitored signal comprises one of the bi-directional links in the communication bus, and the monitored signal comprises a data signal on the bi-directional link.

In embodiments of such interface, said link carrying a monitored signal comprises one of the bi-directional links in the communication bus, and the monitored signal comprises a control signal on the bi-directional link.

In embodiments of such interface, said link carrying a monitored signal comprises a link emulating a bi-directional link in the communication bus.

In embodiments of such interface, said receive clock generator comprises a phase-locked loop, coupled to the reference clock, and producing a set of frequency divided output clocks, a mixer, responsive to the phase control signal and the set of frequency divided output clocks, to generate the receive clock, and memory storing a value of the phase control signal.

In embodiments of such interface, said transmit clock generator comprises a phase-locked loop, coupled to the reference clock, and producing a set of output clocks, a mixer, responsive to the phase control signal and the set of output clocks, to generate the transmit clock, and memory storing a value of the phase control signal.

In embodiments of such interface, calibration logic is included to determine a value of the phase control signal, and wherein said calibration logic is responsive to said indication to re-calibrate the value of the phase control signal In embodiments of such interface, logic responsive to said indication to adjust a value of said phase control signal based on said detected changes in phase.

In embodiments of such interface, the phase detector detects the phase between the reference clock and the monitored signal in response to a phase difference between one of the receive and transmit clocks, and the monitored signal.

In embodiments of such interface, a tracking clock generator is included coupled to the phase detector and to the reference clock which generates a tracking clock, and wherein the phase detector detects the phase between the reference clock and the monitored signal in response to a phase difference between one of the tracking clock and the monitored signal.

In embodiments of such interface, memory is included to store a transmit phase control signal for the transmit clock generator and to store a receive phase control signal for the receive clock generator.

In embodiments of such interface, the monitored signal is transmitted by a remote component.

In embodiments of such interface, the monitored signal is transmitted at the interface.

In embodiments of such interface, the drift tracking circuit is configured for monitoring first signals transmitted by the interface and second signals transmitted by a remote component, and including logic to select the monitored signal from one of the first signals and second signals.

A method for calibrating a communication channel, including a first component, a second component, and a communication link coupling the first and second components, the communication channel having a parameter with an operation value determined by calibration is described, comprising: setting the operation value of the parameter of the communication channel in one of the first and second components; supplying from the first component, a monitor signal on a channel which loops back to the first component; monitoring, using monitor circuits in the first components, a signal from a medium outside the communication channel, the signal having a characteristic which drifts relative to the reference clock signal at said monitor circuits by amounts that correlate with drift of the parameter of the communication channel, to track the amounts of drift in the characteristic; and in response to the monitoring, updating the operation value based on the amounts of drift in the characteristic of the signal.

A method for calibrating a communication channel, including a first component, a second component, and a communication link coupling the first and second components, the communication channel having a drive timing point with an operation value determined by calibration is described, comprising: setting the operation value of the drive timing point of the communication channel; monitoring a signal from a medium outside the communication channel, the signal having a characteristic which drifts by amounts that correlate with drift of the drive timing point of the communication channel, to track the amounts of drift in the characteristic; and in response to the monitoring, updating the operation value based on the amounts of drift in the characteristic of the signal.

A method for calibrating a communication channel, including a first component, a second component, and a communication link coupling the first and second components, the communication channel having a drive timing point with an operation value determined by calibration is described, comprising: setting the operation values of the drive timing point and sample timing point of the communication channel; monitoring a signal from a medium outside the communication channel, the signal having a characteristic which drifts by amounts that correlate with drift of the drive timing point and sample timing point of the communication channel, to track the amounts of drift in the characteristic; and in response to the monitoring, updating the operation values of the drive timing point and sample timing point based on the amounts of drift in the characteristic of the signal.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operation in a memory controller chip component to control an external dynamic random access memory (DRAM) device, the method, comprising:
    receiving read data from the external DRAM device in connection with a read operation;
    receiving, during a calibration operation, a calibration pattern from the external DRAM device;
    setting a sample point timing of a receiver circuit based on the calibration pattern;
    receiving a data strobe signal from the external DRAM device, wherein the receiver circuit is to sample the read data based on the data strobe signal in accordance with the sample point timing;
    determining an amount of drift in the data strobe signal; and
    updating the sample point timing of the receiver based on the amount of drift detected.

2. The method of claim 1, further comprising transmitting a read command to the external DRAM device, and receiving data from the external DRAM device in connection with the read command, wherein receiving the data is performed by the data receiver using the sample point timing.

3. The method of claim 1, further comprising, during the calibration operation, setting the sample timing point of the data receiver to a calibration value, wherein the calibration value corresponds to a first edge value of a first edge of a timing window.

4. The method of claim 1, further comprising:
    generating a set of internal reference clock signals; and
    phase mixing the set of internal reference clock signals to generate a receive clock signal having the sample point timing.

5. The method of claim 1, further comprising:
    updating a drive timing point of a transmitter based on the amount of drift detected.

6. The method of claim 1, further comprising:
    calibrating an initial phase to transmit write data in connection with a write operation; generating a transmit clock signal to time transmission of the write data; and
    outputting the write data in connection with a write operation.

7. The method of claim 1, further comprising:
    determining whether the amount of drift in the data strobe signal exceeds a threshold; and
    wherein updating the sample timing point of the receiver based on the amount of drift occurs in response to determining that the amount of drift exceeds the threshold.

8. A memory controller chip component to control an external dynamic random access memory (DRAM) device, the memory controller chip component comprising:
    a data receiver circuit to receive read data from the external DRAM device in connection with a read operation, wherein the data receiver circuit to receive, during a calibration operation, a calibration pattern from the external DRAM device, wherein a sample point timing of the data receiver circuit is to be set based on the calibration pattern;
    a data strobe receiver circuit to receive a data strobe signal from the external DRAM device, wherein the data receiver circuit is to sample the read data based on the data strobe signal in accordance with the sample point timing; and
    a tracking circuit to determine an amount of drift in the data strobe signal received by the data strobe receiver circuit, the tracking circuit to update the sample point timing of the data receiver circuit based on the amount of drift detected.

9. The memory controller chip component of claim 8, further comprising a circuit to transmit a read command to the external DRAM device, and wherein the data receiver circuit is to receive, using the sample point timing, data from the external DRAM device in connection with the read command.

10. The memory controller chip component of claim 9, wherein the tracking circuit is to set the sample point timing of the data receiver to a calibration value, wherein the calibration value corresponds to a first edge value of a first edge of a timing window corresponding to the data.

11. The memory controller chip component of claim 8, further comprising:
    a circuit to generate a set of internal reference clock signals; and
    a phase mixer to receive the set of internal reference clock signals and generate a receive clock signal having the sample point timing.

12. The memory controller chip component of claim 8, further comprising:
    a transmitter circuit to output the write data in connection with the write operation, wherein the tracking circuit to further update a drive timing point of the transmitter based on the amount of drift detected.

13. The memory controller chip component of claim 8, further comprising:
    a circuit to calibrate an initial phase of an internal clock used to transmit write data in connection with a write operation; and
    a transmitter circuit to output the write data in connection with the write operation.

14. The memory controller chip component of claim 8, wherein the tracking circuit is further to determine whether the amount of drift in the data strobe signal exceeds a threshold, and update the sample point timing of the data receiver circuit in response to the amount of drift exceeding the threshold.

15. A chip component to control an external dynamic random access memory (DRAM) device, the chip component comprising:
- a data receiver circuit to receive read data from the external DRAM device in connection with a read operation, wherein the data receiver circuit to receive, during a calibration operation, a calibration pattern from the external DRAM device, wherein a sample point timing of the data receiver circuit is to be set based on the calibration pattern; and
- a tracking circuit to determine an amount of drift in a signal received from the external DRAM device, the tracking circuit to update the sample point timing of the data receiver circuit based on the amount of drift detected.

16. The chip component of claim 15, wherein the calibration pattern is a data pattern.

17. The chip component of claim 15, wherein the signal is a read strobe signal.

18. The chip component of claim 15, further comprising a command interface to transmit a read command.

19. The chip component of claim 18, wherein the data receiver circuit is to sample data in connection with the read command using the sample point timing.

20. The chip component of claim 15, wherein the chip component is a memory controller chip component.

* * * * *